US009595537B2

(12) United States Patent
Lee et al.

(10) Patent No.: US 9,595,537 B2
(45) Date of Patent: Mar. 14, 2017

(54) DISPLAY PANEL

(71) Applicant: InnoLux Corporation, Miao-Li County (TW)

(72) Inventors: Kuan-Feng Lee, Miao-Li County (TW); Kuo-Chang Chiang, Miao-Li County (TW); Tzu-Min Yan, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 14/958,049

(22) Filed: Dec. 3, 2015

(65) Prior Publication Data

US 2016/0181423 A1   Jun. 23, 2016

(30) Foreign Application Priority Data

Dec. 22, 2014 (TW) .............................. 103144723 A (51) Int. Cl.
*H01L 27/12* (2006.01)
(52) U.S. Cl.
CPC ................................ *H01L 27/1214* (2013.01)

(58) Field of Classification Search
CPC ............. H01L 27/1214; H01L 29/7843; H01L 2251/5315; H01L 2227/323
See application file for complete search history.

(56) References Cited

U.S. PATENT DOCUMENTS

2001/0017371 A1*  8/2001  Tanaka .............. G02F 1/133345
257/59

\* cited by examiner

*Primary Examiner* — Tucker J Wright
(74) *Attorney, Agent, or Firm* — McClure, Qualey & Rodack, LLP (57) ABSTRACT

A display panel is provided, which includes a first substrate, a first insulating layer on the first substrate, a semiconductor layer on the first insulating layer, and a second insulating layer on the semiconductor layer and the first insulating layer. The second insulating layer has a surface in the vicinity of the first insulating layer. The second insulating layer has a first region. The first region is 40 nm in depth starting from the surface of the second insulating layer, and the second insulating layer has a fluoride ion gain ratio of 80% to 95% in the first region.

18 Claims, 6 Drawing Sheets

DISPLAY PANEL

CROSS REFERENCE TO RELATED APPLICATIONS

This application claims priority of Taiwan Patent Application No. 103144723, filed on Dec. 22, 2014, the entirety of which is incorporated by reference herein.

BACKGROUND

Technical Field

The disclosure relates to a display panel.

Description of the Related Art

In a conventional deposition for an insulating layer (e.g. made of silicon oxide or silicon nitride), the deposition chamber should be cleaned after repeated deposition steps. In general, the deposition chamber is cleaned by fluoride ions ($F^{31}$), which are formed by treating fluorine-containing gas (e.g. $Ar+NF_3$) with a remote plasma and then conducted into the deposition chamber. However, the fluoride ions of the cleaning process will remain in the deposition chamber, and then are mixed in with the insulating layer deposited in a subsequent deposition process. The degree to which the fluoride ions accumulated on the surface of the insulating layer will influence the semiconductor device's performance. An overly high or overly low degree of accumulation will negatively influence performance, and should be modified to improve the performance of the semiconductor device.

BRIEF SUMMARY

One embodiment of the disclosure provides a display panel, comprising: a first substrate; a first insulating layer on the first substrate; a semiconductor layer on the first insulating layer; and a second insulating layer on the semiconductor layer and the first insulating layer, wherein the second insulating layer has a surface in the vicinity of the first insulating layer, wherein the second insulating layer has a first region, wherein the first region is 40 nm in depth starting from the surface of the second insulating layer, and wherein the second insulating layer has a fluoride ion gain ratio of 80% to 95% in the first region.

One embodiment of the disclosure provides a display panel, comprising: a first substrate; and a semiconductor layer on the first substrate; a first insulating layer on the semiconductor layer; and a second insulating layer on the first insulating layer, wherein the second insulating layer has a surface in the vicinity of the first insulating layer, wherein the second insulating layer has a first region, wherein the first region is 40 nm in depth starting from the surface of the second insulating layer, and wherein the second insulating layer has a fluoride ion gain ratio of 80% to 95% in the first region.

A detailed description is given in the following embodiments with reference to the accompanying drawings.

BRIEF DESCRIPTION OF THE DRAWINGS

The disclosure can be more fully understood by reading the subsequent detailed description and examples with references made to the accompanying drawings, wherein.

DETAILED DESCRIPTION

The following description is of the best-contemplated mode of carrying out the disclosure. This description is made for the purpose of illustrating the general principles of the disclosure and should not be taken in a limiting sense. The scope of the disclosure is best determined by reference to the appended claims.

Figure 1:
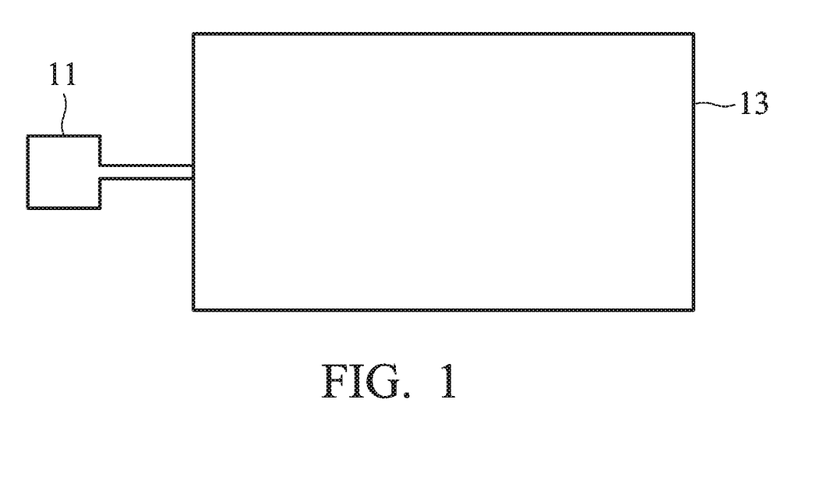
FIGS. 1 to 3 show a process for depositing a second insulating layer in one embodiment of the disclosure.

One embodiment provides a method for manufacturing a display panel. As shown in FIG. 1, a remote plasma source 11 applies plasma to fluorine-containing chemical (e.g. $Ar+NF_3$) to form fluoride ions. Subsequently, the fluoride ions are conducted into the deposition chamber 13 to clean the deposition chamber 13.

The fluoride ions in the deposition chamber are then reduced, and a first substrate 15 is then transferred into the deposition chamber 13. The first substrate 15 includes a first insulating layer 43 and a semiconductor layer 17 deposited thereon. In one embodiment, the first substrate 15 can be a transparent rigid inorganic material (e.g. glass, quartz, or the like), an opaque rigid inorganic material (e.g. wafer, ceramic, or the like), or a flexible organic material (e.g. plastic, rubber, polyester, polyimide, polycarbonate, or the like). In one embodiment, the first insulation layer 43 can be silicon oxide, silicon nitride, silicon oxynitride, or a combination thereof. The semiconductor layer 17 can be amorphous silicon, poly silicon, indium-gallium-zinc oxide (IGZO), indium-gallium-zinc-tin oxide (IGZTO), zinc oxide (ZnO), indium-zinc-tin oxide (IZTO), gallium-zinc oxide (GZO), or zinc-tin oxide (ZTO).

Figure 2:
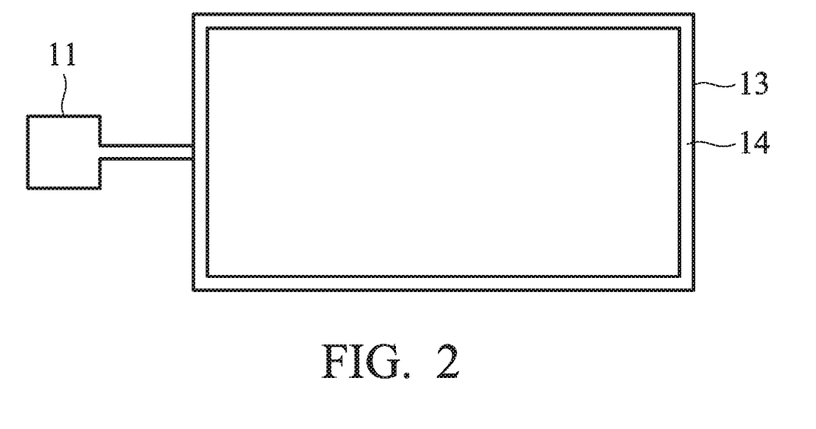

In one embodiment, the step of reducing the fluoride ions in the deposition chamber 13 includes (1) vacuuming out the un-reacted fluoride ions (and compounds formed of reactions of the fluoride ions) from the deposition chamber 13 by a pump, and (2) depositing a fluoride ion absorbing layer 14 on inner walls of the deposition chamber 13, as shown in FIG. 2. In general, the fluoride ion absorbing layer 14 and the second insulating layer 19 (See FIG. 3) should have the same composition, thereby avoiding the composition of the second insulating layer 19 being influenced by the composition of the fluoride ion absorbing layer 14. For example, when the subsequently formed second insulating layer 19 includes silicon oxide, the fluoride ion absorbing layer 14 will be silicon oxide too. When the subsequently formed second insulating layer 19 includes silicon nitride, the fluoride ion absorbing layer 14 will be silicon nitride too. When the subsequently formed second insulating layer 19 includes silicon oxynitride, the fluoride ion absorbing layer 14 will be a bi-layered structure of silicon nitride and silicon oxide. However, the above embodiments are for illustration only. Alternatively, the fluoride ion absorbing layer 14 and the second insulating layer 19 can be composed of different materials. In different embodiments, the fluoride ion absorbing layer 14 can be a silicon oxide layer, a silicon nitride layer, or a bi-layered structure of silicon nitride and silicon oxide with a total thickness of 200 nm to 1000 nm.

Figure 3:
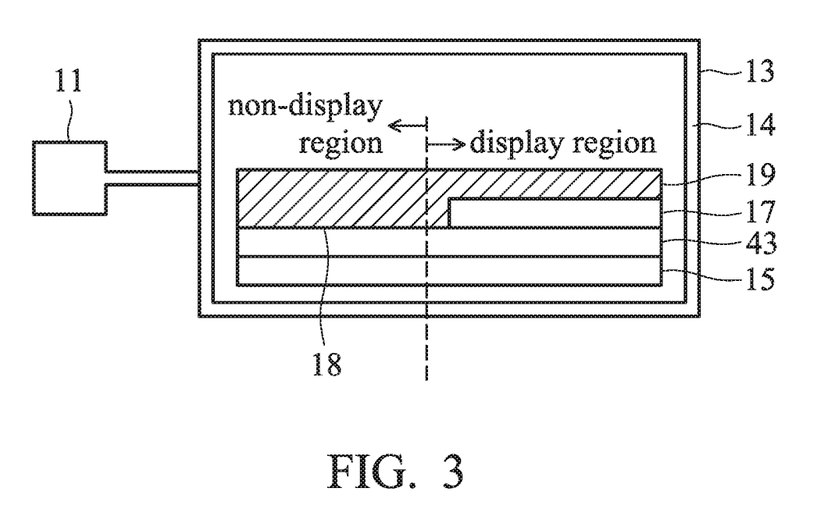

Subsequently, a second insulating layer 19 is deposited on the first insulating layer 43 and the semiconductor layer 17, and the second insulating layer 19 has a surface 18 in the vicinity of the first insulating layer 43. As described above, the second insulating layer 19 can be silicon oxide, silicon nitride, silicon oxynitride, or a combination thereof. Because the fluoride ion absorbing layer 14 is deposited on the inner walls of the deposition chamber 13 before depositing the second insulating layer 19, the fluoride ions on the deposition chamber 13 are reduced during the deposition of the second insulating layer 19. As such, the accumulating concentration of the fluoride ions in the second insulating layer 19 at the surface 18 can be effectively reduced.

In another embodiment, the semiconductor layer 17 is disposed between the first insulating layer 43 and the first substrate 15. The following steps of forming the fluoride ion absorbing layer 14 and depositing the second insulating layer 19 are similar to the previously described embodiment and the description thereof is omitted here.

In the following examples, secondary ion mass spectrometry (SIMS) was used to measure the fluoride ion content in the second insulating layer 19 corresponding to a non-display region of the first substrate. Although the measurement was performed in the non-display region of the first substrate, the second insulating layer was deposited on the display region and the non-display region. As such, the fluoride ion distribution of the second insulating layer corresponding to the non-display region should be similar to the fluoride ion distribution of the second insulating layer corresponding to the display region. The measurement factors in the examples are shown below:

Apparatus used: CAMECA IMS 6F
Source: $Cs^+$
Energy: 15 KeV
Collected area (in diameter): 30 μm The measurement result shows that the second insulating layer 19 had different fluoride ion contents at different distances from the surface 18. The unit of the fluoride ion signal intensity measured by the SIMS was counts per second. The fluoride ion signal intensity was inconsistent due to different types of ion source used in the detection. As such, the disclosure provides a method to measure the fluoride ion content that is not influenced by the different types of ion source used in the detection, in which the fluoride ion signal intensity at a depth of the total measure region minus the fluoride ion background intensity equals the fluoride ion correction value at the depth. The fluoride ion correction values at all depths of the total measure region could be integrated to obtain a fluoride ion gain value of the total measure region. Furthermore, the fluoride ion correction values in a predetermined region of the total measure region were integrated to obtain a fluoride ion gain value of the predetermined region, which could be divided by the fluoride ion gain value of the total measure region to obtain the fluoride ion gain ratio of the predetermined region. In the disclosure, the total measure region T was defined as a region (in the second insulating layer) of 0 to 80 nm from the surface. In further detail definition, the total measure region T is 80 nm in depth starting from the surface of the second insulating layer. The surface of the second insulating layer is in the vicinity of the first insulating layer. The fluoride ion background intensity was defined as the lowest fluoride ion signal intensity measured in a second region B of the second insulating layer, and the second region B was 40 nm to 80 nm from the surface. In further detail definition, a first region A is 40 nm in depth starting from the surface of the second insulating layer, and the second region B is 40 nm in depth immediately following the first region A.

In a first example, the fluoride ions in the deposition chamber 13 were vacuumed out, and a silicon oxide layer with a thickness of about 200 nm was then deposited on inner walls of the deposition chamber 13, thereby reducing the fluoride ions in the deposition chamber 13. The fluoride ions in the deposition chamber 13 were reduced before depositing a second insulating layer 19, thereby reducing the fluoride ion concentration of the second insulating layer 19 near the surface 18. As shown in the result of a measurement of the SIMS in FIG. 4, a first region A of the second insulating layer 19 (0 nm to 40 nm from the surface 18) had a maximum fluoride ion signal intensity of 1.79E6 (C/S). In further detail definition, the first region A is 40 nm in depth starting from the surface of the second insulating layer. The surface of the second insulating layer is in the vicinity of the first insulating layer. A second region B of the second insulating layer 19 (40 nm to 80 nm from the surface 18) had a minimum fluoride ion signal intensity serving as a fluoride ion background intensity $I_B$. The fluoride ion signal intensity (solid line) was changed according to distances from the surface in the first example. The fluoride ion correction value was the fluoride ion signal intensity minus the fluoride ion background intensity $I_B$. The fluoride ion correction value in the first region A (0 nm to 40 nm from the surface 18) was integrated to obtain a fluoride ion gain value of the first region A. The fluoride ion correction value in the total measure region T (0 nm to 80 nm from the surface 18) was integrated to obtain a fluoride ion gain value of the total measure region T. The fluoride ion gain value of the first region A was divided by the fluoride ion gain value of the first region T to obtain a fluoride ion gain ratio of the first region A, which was about 88% in the first example. In other words, a fluoride ion gain ratio of the second region B (40 nm to 80 nm from the surface 18) was about 12%. In addition, if the thickness of the silicon oxide layer deposited on the inner walls of the deposition chamber was increased, the fluoride ion gain ratio of the first region A would be further reduced. For example, if the thickness of the silicon oxide layer deposited on the inner walls of the deposition chamber was about 1000 nm, the fluoride ion gain ratio of the first region A would be 82% and the fluoride ion gain ratio of the second region B would be 18%. In other words, the fluoride ion gain ratio of the first region A and the fluoride ion gain ratio of the second region B had a ratio of about 4.6 to 7.3 when the silicon oxide was selected as the fluoride ion absorbing layer 14.

Figure 4:
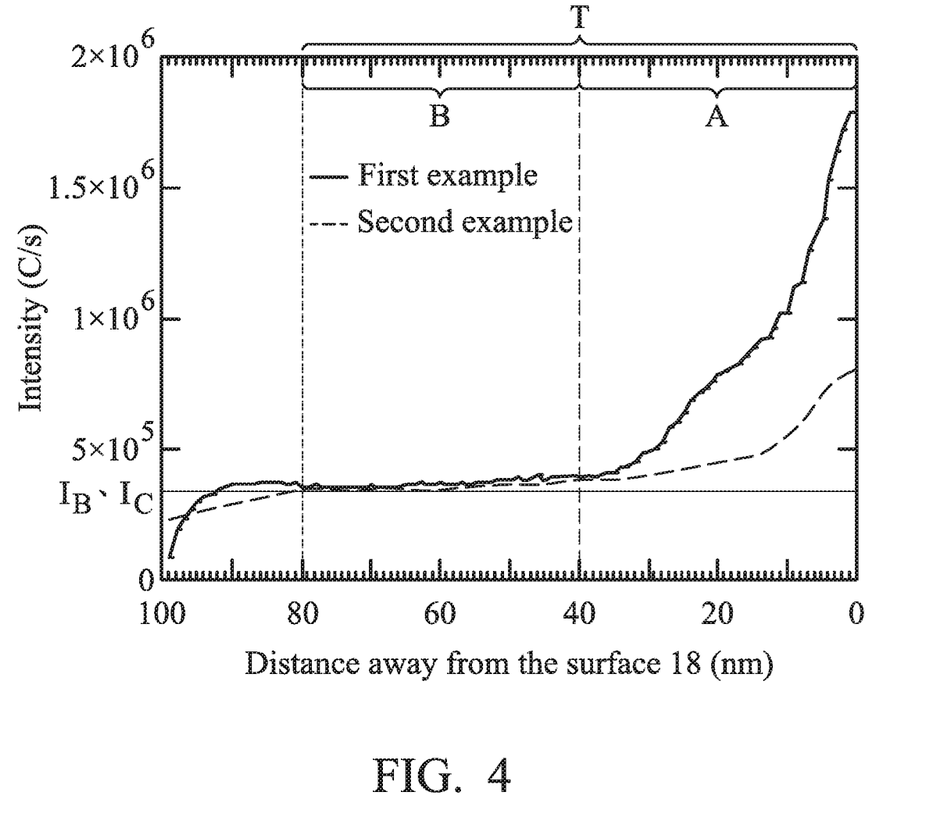
FIG. 4 shows the result of a measurement of the SIMS in a first example and a second example of the disclosure.

In a second example, the fluoride ions in the deposition chamber 13 were vacuumed out, and a silicon nitride layer with a thickness of about 200 nm was then deposited on inner walls of the deposition chamber 13, thereby reducing the fluoride ions in the deposition chamber 13. Because the fluoride ions in the deposition chamber 13 were reduced before depositing a second insulating layer 19, thereby reducing the fluoride ion concentration of the second insulating layer 19 near the surface 18. As shown in the result of a measurement of the SIMS in FIG. 4, a first region A of the second insulating layer 19 (0 nm to 40 nm from the surface 18) had a maximum fluoride ion signal intensity of 8.09E5 (C/S), and a second region B of the second insulating layer 19 (40 nm to 80 nm from the surface 18) had a minimum fluoride ion signal intensity serving as a fluoride ion background intensity $I_C$. In FIG. 4, $I_B$ and $I_C$ are nearly overlapping. The fluoride ion signal intensity (dashed line) was changed according to distances from the surface in the second example. The fluoride ion correction value was the fluoride ion signal intensity minus the fluoride ion background intensity $I_C$. The fluoride ion correction value in the first region A (0 nm to 40 nm from the surface 18) was integrated to obtain a fluoride ion gain value of the first region A. The fluoride ion correction value in the total measure region T (0 nm to 80 nm from the surface 18) was integrated to obtain a fluoride ion gain value of the total measure region T. The fluoride ion gain value of the first region A was divided by the fluoride ion gain value of the first region T to obtain a fluoride ion gain ratio of the first region A, which was about 95% in the second example. In other words, a fluoride ion gain ratio of the second region B (40 nm to 80 nm from the surface 18) was about 5%. Similarly, if the thickness of the silicon nitride layer deposited on the inner walls of the deposition chamber was increased, the fluoride ion gain ratio of the first region A would be further reduced. For example, if the thickness of the silicon nitride layer deposited on the inner walls of the deposition chamber was about 1000 nm, the fluoride ion gain ratio of the first region A would be 88% and the fluoride ion gain ratio of the second region B would be 12%. In other words, the fluoride ion gain ratio of the first region A and the fluoride ion gain ratio of the second region B had a ratio of about 7.3 to 19.0 when the silicon nitride was selected as the fluoride ion absorbing layer 14.

In third example, the fluoride ions in the deposition chamber 13 were vacuumed out, and a bi-layered structure of silicon oxide and silicon nitride with a total thickness of about 200 nm was then deposited on inner walls of the deposition chamber 13, thereby reducing the fluoride ions in the deposition chamber 13. The fluoride ions in the deposition chamber 13 were reduced before depositing a second insulating layer 19, thereby reducing the fluoride ion concentration of the second insulating layer 19 near the surface 18. As shown in the result of a measurement of the SIMS, a first region A of the second insulating layer 19 (0 nm to 40 nm from the surface 18) had a maximum fluoride ion signal intensity of 2.57E6 (C/S), the fluoride ion gain ratio of the first region A in the second insulating layer 19 (0 nm to 40 nm from the surface 18) was about 83%, and the fluoride ion gain ratio of the second region B in the second insulating layer 19 (40 nm to 80 nm from the surface 18) was about 17%. Similarly, if the thickness of the bi-layered structure of silicon oxide and silicon nitride deposited on the inner walls of the deposition chamber was increased, the fluoride ion gain ratio of the first region A would be further reduced. For example, if the thickness of the bi-layered structure of silicon oxide and silicon nitride deposited on the inner walls of the deposition chamber was about 1000 nm, the fluoride ion gain ratio of the first region A would be 80% and the fluoride ion gain ratio of the second region B would be 20%. In other words, the fluoride ion gain ratio of the first region A and the fluoride ion gain ratio of the second region B had a ratio of about 4.0 to 4.9 when the bi-layered structure of silicon oxide and silicon nitride was selected as the fluoride ion absorbing layer 14.

In summary, if a fluoride ion absorbing layer 14 is deposited on inner walls of the deposition chamber 13 before depositing the second insulating layer 19 as illustrated in the first example to third example, the fluoride ion concentration of the second insulating layer 19 near the surface 18 will be reduced. According to electrical measurements of first example to third example, the thin film transistors thereof had a threshold voltage of 0V to 1V and a magnetic hysteresis value of 0V to 0.5V.

As shown in the result of a measurement of the SIMS, different compositions of the fluoride ion absorbing layer 14 can reduce the accumulation of the fluoride ions near the surface 18 of the second insulating layer 19, and the difference between the different compositions is just the reduction degree. As described above, the fluoride ion gain ratio of the first region A in the second insulating layer 19 (0 nm to 40 nm from the surface 18) was about 80% to 83% when the bi-layered structure of silicon oxide and silicon nitride was selected as the fluoride ion absorbing layer 14. The fluoride ion gain ratio of the first region A in the second insulating layer 19 (0 nm to 40 nm from the surface 18) was about 82% to 88% when the silicon oxide was selected as the fluoride ion absorbing layer 14. The fluoride ion gain ratio of the first region A in the second insulating layer 19 (0 nm to 40 nm from the surface 18) was about 88% to 95% when the silicon nitride was selected as the fluoride ion absorbing layer 14.

Accordingly, the fluoride ions in the deposition chamber 13 were reduced before depositing the second insulating layer 19 on the semiconductor layer 17, thereby effectively reducing the fluoride ion concentration of the second insulating layer 19 near the surface 18. As such, the thin film transistor properties such as threshold voltage and magnetic hysteresis value can be improved.

Figure 5A:
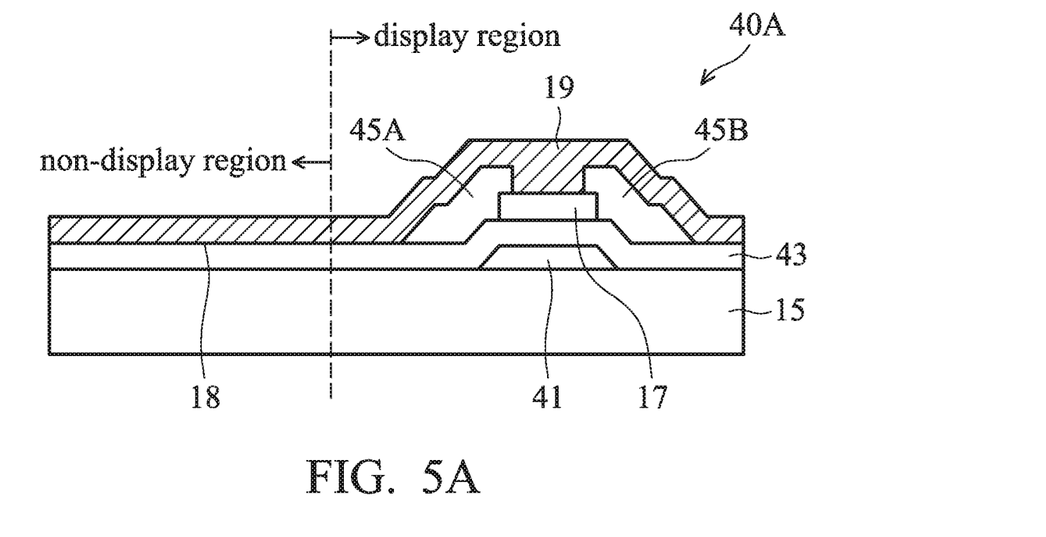
FIGS. 5A-5C and 6 show thin film transistors in embodiments of the disclosure.

The described structure can be further applied in any type of thin film transistor. As shown in FIG. 5A, a thin film transistor 40A is a bottom-gate structure. A gate electrode 41 and a first insulating layer 43 are sequentially formed on a first substrate 15, and a semiconductor layer 17 is then formed on the first insulating layer 43. The semiconductor layer 17 is then patterned to serve as a channel layer of the thin film transistor 40A. A source electrode 45A and a drain electrode 45B are formed on two sides of the patterned semiconductor layer 17 to electrically connect to two sides of the patterned semiconductor layer 17 (i.e. the channel layer). Subsequently, a second insulating layer 19 is formed on the first insulating layer 43, the drain electrode 45A, the drain electrode 45B, and the patterned semiconductor layer 17. Before forming the second insulating layer 19, the fluoride ions in the deposition chamber 13 should be reduced as described above.

Figure 5B:
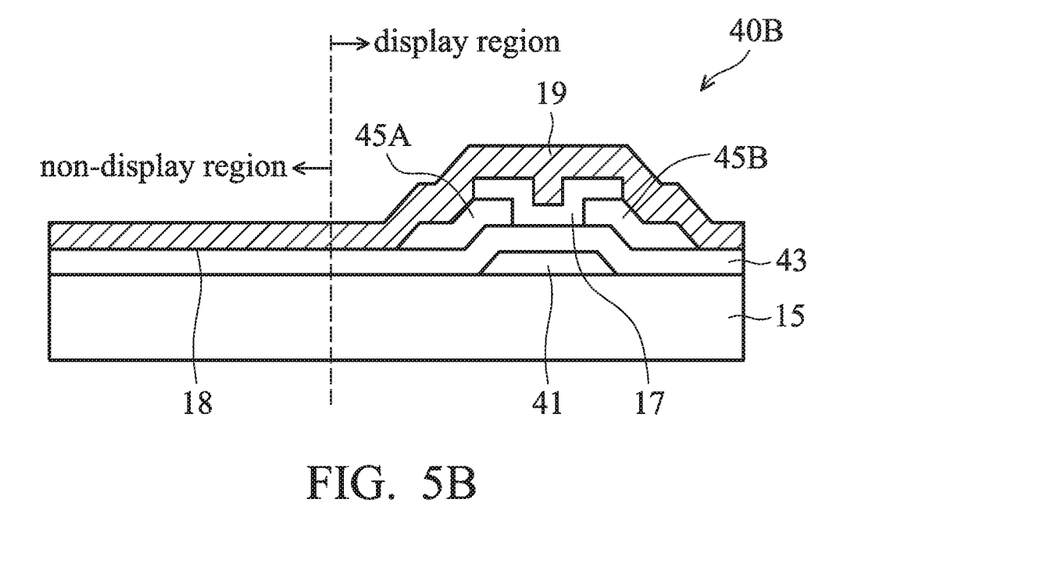

As shown in FIG. 5B, a thin film transistor 40B is a bottom-gate structure. A gate electrode 41 and a first insulating layer 43 are sequentially formed on a first substrate 15, and a source electrode 45A and a drain electrode 45B are formed on the first insulating layer overlying two sides of the gate electrode 41. Subsequently, a semiconductor layer 17 is formed on the above structure, and then patterned to serve as a channel layer of the thin film transistor 40B. The source electrode 45A and the drain electrode 45B are electrically connected to two sides of the patterned semiconductor layer 17. A second insulating layer 19 is then formed on the semiconductor layer 17, the source electrode 45A, and the drain electrode 45B. Before forming the second insulating layer 19, the fluoride ions in the deposition chamber 13 should be reduced as described above.

Figure 5C:
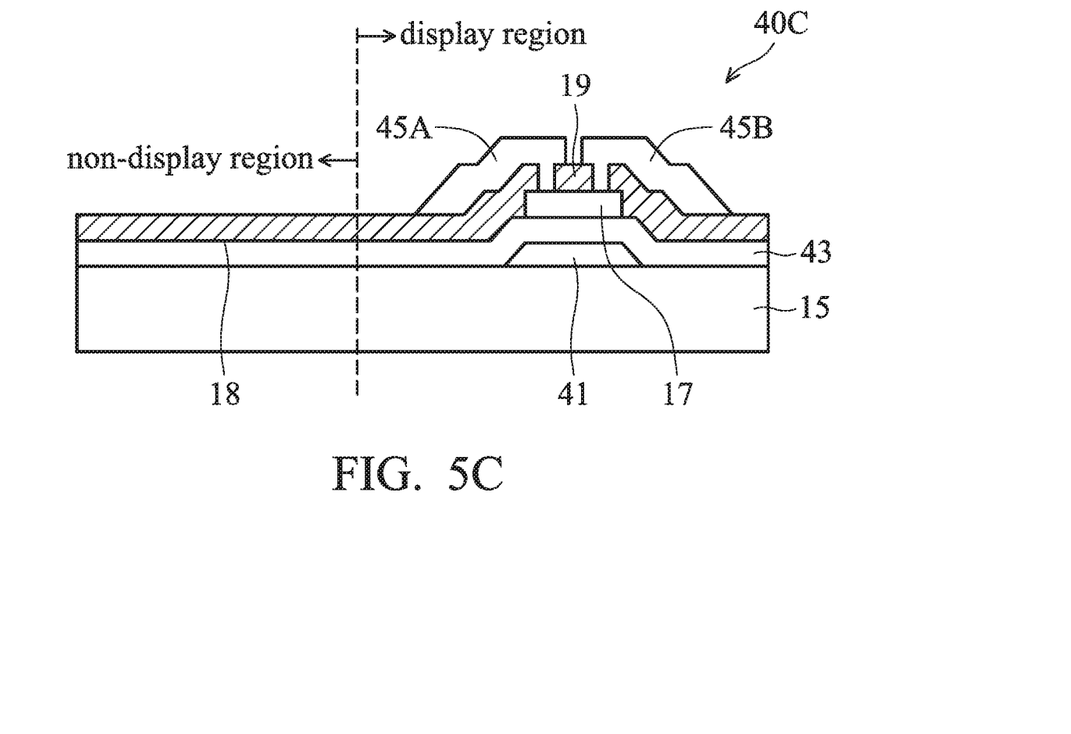

As shown in FIG. 5C, a thin film transistor 40C is a bottom-gate structure. A gate electrode 41 and a first insulating layer 43 can be sequentially formed on a first substrate 15, and a semiconductor layer 17 is then formed on the first insulating layer 43. The semiconductor layer 17 is then patterned to serve as a channel layer of the thin film transistor 40C. A second insulating layer 19 is then formed on the semiconductor layer 17. Before forming the second insulating layer 19, the fluoride ions in the deposition chamber 13 should be reduced as described above. The second insulating layer 19 is then patterned to expose two sides of the semiconductor layer 17. Subsequently, a source electrode 45A and a drain electrode 45B are formed to electrically connect to the two sides of the semiconductor layer 17, respectively.

Figure 6:
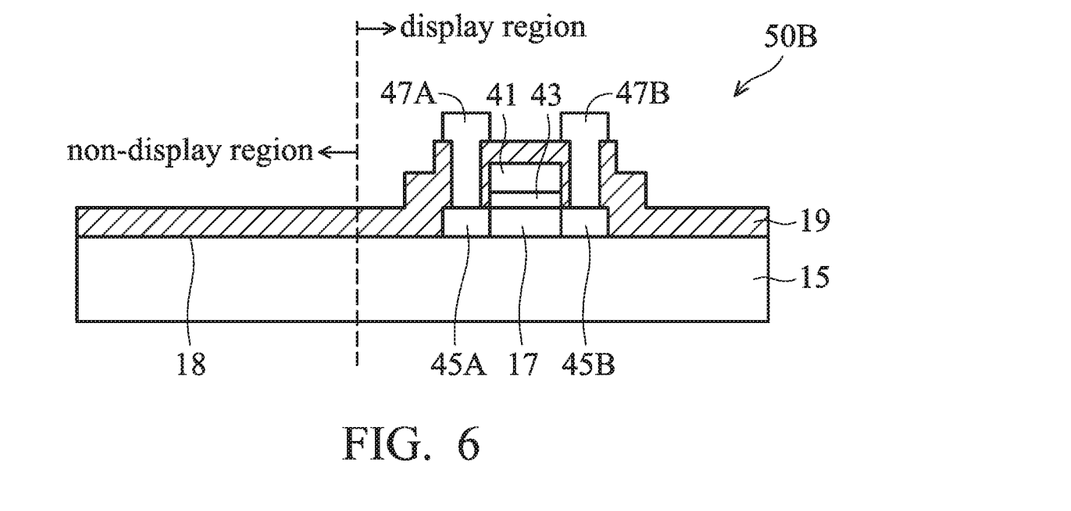

As shown in FIG. 6, a thin film transistor 50B is a top-gate structure. A semiconductor layer 17 is formed, and an insulating layer is patterned to form a first insulating layer 43 covering a center part of the semiconductor layer 17. Subsequently, a gate electrode 41 is formed on the first insulating layer 43. A second insulating layer 19 is then formed on the gate electrode 41 and two sides of the semiconductor layer 17. The two sides of the semiconductor layer 17 are defined as a source region 45A and a drain region 45B. Then, the second insulating layer 19 is patterned to form two via holes for a source electrode 47A and a drain electrode 47B electrically contacting the source region 45A and the drain region 45B. The second insulating layer 19 has a surface 18 in the vicinity of the first substrate 15. Before forming the second insulating layer 19, the fluoride ions in the deposition chamber 13 should be reduced as described above.

Figure 7:
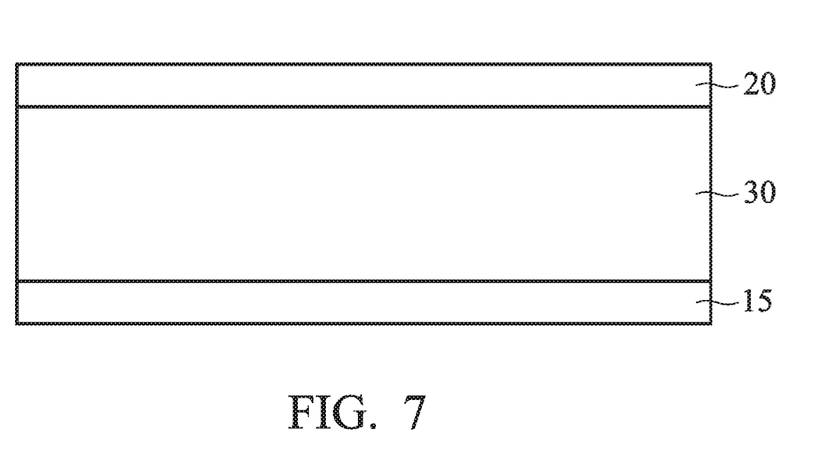
FIG. 7 shows a display panel in one embodiment of the disclosure.

As shown in FIG. 7, the display panel in one embodiment further includes a second substrate 20 and a display medium 30 between the first substrate 15 and the second substrate 20. The display medium 30 can be a liquid crystal layer, inorganic light emitting diode or an OLED device. The second substrate 20 can be a transparent rigid inorganic material (e.g. glass, quartz, or the like) or a flexible organic material (e.g. plastic, rubber, polyester, polyimide, polycarbonate, or the like).

While the disclosure has been described by way of example and in terms of the preferred embodiments, it is to be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A display panel, comprising:
a first substrate;
a first insulating layer on the first substrate;
a semiconductor layer on the first insulating layer; and
a second insulating layer on the semiconductor layer and the first insulating layer, wherein the second insulating layer has a surface in the vicinity of the first insulating layer,
wherein the second insulating layer has a first region, wherein the first region is 40 nm in depth starting from the surface of the second insulating layer, and
wherein the second insulating layer has a fluoride ion gain ratio of 80% to 95% in the first region.

2. The display panel as claimed in claim 1, wherein the second insulating layer has a fluoride ion gain ratio of 80% to 83% in the first region.

3. The display panel as claimed in claim 1, wherein the second insulating layer has a fluoride ion gain ratio of 82% to 88% in the first region.

4. The display panel as claimed in claim 1, wherein the second insulating layer has a fluoride ion gain ratio of 88% to 95% in the first region.

5. The display panel as claimed in claim 1, wherein the fluoride ion gain ratio in the first region is an integral value of a fluoride ion correction value in the first region divided by an integral value of the fluoride ion correction value in a total measure region which is 80 nm in depth starting from the surface of the second insulating layer.

6. The display panel as claimed in claim 5, wherein the fluoride ion correction value is a fluoride ion signal intensity at a depth of the second insulating layer minus a fluoride ion background intensity, wherein the fluoride ion background intensity is a lowest fluoride ion signal intensity measured in a second region of the second insulating layer, and the second region is 40 nm in depth immediately following the first region.

7. The display panel as claimed in claim 1, further comprising:
a gate electrode between the first substrate and the first insulating layer; and
a source electrode and a drain electrode on the first insulating layer and electrically connected to two sides of the semiconductor layer, respectively,
wherein the second insulating layer covers the first insulating layer, the semiconductor layer, the source electrode, and the drain electrode.

8. The display panel as claimed in claim 1, further comprising:
a gate electrode between the first substrate and the first insulating layer; and
a source electrode and a drain electrode on the first insulating layer,
wherein the semiconductor layer is on the source electrode and the drain electrode and electrically connected to the source electrode and the drain electrode.

9. The display panel as claimed in claim 1, further comprising:
a gate electrode between the first substrate and the first insulating layer; and
a source electrode and a drain electrode on the second insulating layer,
wherein the source electrode and the drain electrode penetrate the second insulating layer to electrically connect to two sides of the semiconductor layer, respectively.

10. The display panel as claimed in claim 1, further comprising:
a second substrate; and
a display medium between the first substrate and the second substrate.

11. A display panel, comprising:
a first substrate; and
a semiconductor layer on the first substrate;
a first insulating layer on a center part of the semiconductor layer; and
a second insulating layer on two sides of the semiconductor layer and the first substrate, wherein the second insulating layer has a surface in the vicinity of the first substrate,
wherein the second insulating layer has a first region, wherein the first region is 40 nm in depth starting from the surface of the second insulating layer, and
wherein the second insulating layer has a fluoride ion gain ratio of 80% to 95% in the first region.

12. The display panel as claimed in claim 11, wherein the second insulating layer has a fluoride ion gain ratio of 80% to 83% in the first region.

13. The display panel as claimed in claim 11, wherein the second insulating layer has a fluoride ion gain ratio of 82% to 88% in the first region.

14. The display panel as claimed in claim 11, wherein the second insulating layer has a fluoride ion gain ratio of 88% to 95% in the first region.

15. The display panel as claimed in claim 11, wherein the fluoride ion gain ratio in the first region is an integral value of a fluoride ion correction value in the first region divided by an integral value of the fluoride ion correction value in a total measure region which is 80 nm in depth starting from the surface of the second insulating layer.

16. The display panel as claimed in claim 15, wherein the fluoride ion correction value is a fluoride ion signal intensity at a depth of the second insulating layer minus a fluoride ion background intensity, wherein the fluoride ion background intensity is a lowest fluoride ion signal intensity measured in a second region of the second insulating layer, and the second region is 40 nm in depth immediately following the first region.

17. The display panel as claimed in claim 11, further comprising:
    a gate electrode between the first insulating layer and the second insulating layer; and
    a source electrode and a drain electrode on the second insulating layer and electrically connected to two sides of the semiconductor layer by penetrating the second insulating layer, respectively.

18. The display panel as claimed in claim 11, further comprising:
    a second substrate; and
    a display medium between the first substrate and the second substrate.

* * * * *